United States Patent [19]

Radigan et al.

[11] 4,443,295

[45] Apr. 17, 1984

[54] METHOD OF ETCHING REFRACTORY METAL FILM ON SEMICONDUCTOR STRUCTURES UTILIZING TRIETHYLAMINE AND $H_2O_2$

[75] Inventors: Kenneth J. Radigan, Mountain View; James M. Cleeves, Redwood City, both of Calif.

[73] Assignee: Fairchild Camera & Instrument Corp., Mountain View, Calif.

[21] Appl. No.: 503,976

[22] Filed: Jun. 13, 1983

[51] Int. Cl.³ .......................................... H01L 21/308
[52] U.S. Cl. ................................. 156/657; 134/2; 156/664; 252/79.1
[58] Field of Search .............. 156/664, 650; 252/79.1; 134/2

[56] References Cited

U.S. PATENT DOCUMENTS

| | | | |
|---|---|---|---|
| 3,529,350 | 9/1970 | Rairden | 252/79.1 |
| 3,669,776 | 6/1972 | Eppensteiner | 252/79.1 |
| 3,737,306 | 6/1973 | Byrnes et al. | 134/2 |
| 3,841,931 | 10/1974 | MacAurthur et al. | 156/664 |
| 3,944,496 | 3/1976 | Coggins et al. | 156/664 |
| 4,267,012 | 5/1981 | Pierce et al. | 156/664 |

Primary Examiner—Jerome W. Massie
Attorney, Agent, or Firm—Townsend and Townsend

[57] ABSTRACT

A method is disclosed of etching a refractory metal layer on a semiconductor structure comprising subjecting it to a mixture of a Lewis base and an oxidizing agent. In the preferred embodiment a method is described for etching a tungsten-titanium layer on a semiconductor structure by immersing it in a mixture of triethylamine and hydrogen peroxide.

8 Claims, 3 Drawing Figures

METHOD OF ETCHING REFRACTORY METAL FILM ON SEMICONDUCTOR STRUCTURES UTILIZING TRIETHYLAMINE AND H₂O₂

BACKGROUND OF THE INVENTION

1. Field of the Invention

This invention relates to processes for fabricating integrated circuits, particularly processes in which refractory metal films on semiconductor structures are to be etched. Most specifically the invention relates to the etching of tungsten-titanium layers using triethylamine and hydrogen peroxide.

2. Description of the Prior Art

In the manufacture of integrated circuits active and passive electronic devices are formed in a semiconductor substrate and then interconnected with each other, among other ways, by the formation of electrically conductive material on the upper surface of the semiconductor substrate. The regions of electrically conductive material also provide a path for supplying desired electrical signals to these devices, and receiving the resulting output signals.

One now well-known technique for fabricating electrical connections is to utilize layers of tungsten and titanium, or other refractory metals, in conjunction with aluminum layers. The tungsten-titanium provides a barrier to stop plasma etching of overlying layers, is resistant to high temperatures, and prevents overlying layers from dissolving the underlying silicon and changing the electrical characteristics of the semiconductor structure. Also well-known are the formation of metal silicide electrical connections, such as platinum silicide, to regions in the semiconductor structure.

In one commercially available semiconductor device a platinum silicide contact is used to provide an electrical connection to the doped silicon beneath it. An alloy of tungsten and titanium, typically about 10% titanium, is used between the platinum silicide contact and the primary conducting metal layer of aluminum or gold. The tungsten-titanium film provides the necessary adherence to the underlying silicon dioxide, silicon nitride, and platinum silicide materials. In addition, the tungsten-titanium film serves as a diffusion barrier to prevent the overlying aluminum from dissolving into the underlying silicon and shorting junctions or changing the electrical characteristics of the semiconductor structure.

Tungsten-titanium is not etchable in the usual chemical etchants used to define the aluminum conductors. Thus, in a typical semiconductor fabrication process, after etching the primary conductor (usually aluminum), the tungsten-titanium layer is etched in a separate solution. One common prior art technique for etching tungsten-titanium is to use hydrofluoric acid. Unfortunately this has been found detrimental because the hydrofluoric acid also etches aluminum, silicon dioxide, and platinum silicide, adversely affecting the performance, if not destroying, the functionality of the semiconductor device. In addition, if an oxidizing agent is present the hydrofluoric acid will also etch any exposed silicon. Tungsten is normally etched using a base such as potassium hydroxide or sodium hydroxide. These will also etch silicon and aluminum. *Thin Film Processes,* Vossen and Kern, Academic Press, 1978, pages 474–475.

Another technique which has been used to etch tungsten-titanium is to use a 1:5 mixture of hydrogen peroxide ($H_2O_2$) and water heated to about 45° C. The etching of a 2,000 Angstrom thick film in such a solution typically requires several minutes.

Unfortunately the use of a mixture of hydrogen peroxide and water also has undesirable side effects. It has been observed that corrosion of the overlying aluminum conductor can occur in the mixture. Although the precise cause is still unknown, it is presently believed that the platinum silicide/tungsten-titanium/aluminum combination forms an electrochemical cell with the hydrogen peroxide and water solution and results in localized corrosion. This situation is aggravated when the aluminum has been etched in a chlorine-containing plasma because residual surface aluminum chloride and chlorine not only cause localized formation of hydrochloric acid, but are also highly ionic which further supports the electrochemical cell.

We have discovered that the acidity of the plasma reaction product residues may be suppressed by using a mixture of hydrogen peroxide and ammonium hydroxide ($NH_4OH$) in the ratio of about 3:1. We have found that this mixture prevents the acid corrosion, and that the room temperature etch rate is an order of magnitude faster than the hydrogen peroxide/water solution. Unfortunately, we have also discovered that a mixture of ammonium hydroxide and hydrogen peroxide itself results in further difficulties. The hydrogen peroxide/water mixture has a low ionic character (on the order of 14K ohms). Because the ammonium hydroxide is a highly dissociated inorganic base, the resistivity of the ammonium hydroxide:hydrogen peroxide etchant is about 4 ohms. When this solution is used it has been found that metallized lines connected to ground taps showed accelerated lateral etching resulting in severe undercutting.

For all of the foregoing reasons, an alternative etching solution is desired for the etching of tungsten-titanium layers, and other refractory metal layers, in the fabrication of integrated circuit structures.

SUMMARY OF THE INVENTION

We have discovered that the combination of an organic base and hydrogen peroxide provides a desired high rate of etching, and at the same time also provides the capability of neutralizing the acidity of the plasma reaction products resulting from earlier processing of the semiconductor structure. Being organic in nature, however, the mixture of organic base and hydrogen peroxide does not provide the lower resistivity of the hydrogen peroxide/ammonium hydroxide mixture discussed above, and thus does not exhibit selective accelerated undercutting of metal lines connected to ground.

In particular, we have discovered an improved method of etching refractory metal layers on semiconductor structures comprising subjecting those layers to a mixture of Lewis base and an oxidizing agent. Most specifically the invention relates to an improved method of etching tungsten-titanium on a semiconductor structure comprising subjecting the layer to a mixture of triethylamine and hydrogen peroxide.

DETAILED DESCRIPTION OF THE PREFERRED EMBODIMENTS

Figure 1:
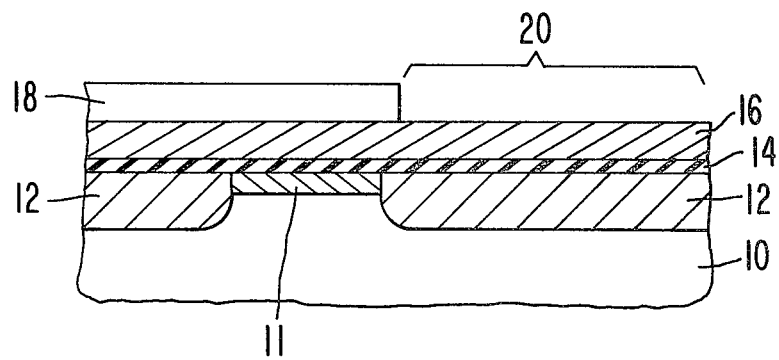
FIG. 1 is a cross-sectional view of a semiconductor structure illustrating a platinum silicide contact, an overlying tungsten-titanium layer, and an upper layer of aluminum with photoresist deposited on it.

FIG. 1 is a cross-sectional view of a semiconductor structure which may be fabricated using well-known techniques. As shown in FIG. 1 the semiconductor structure includes a silicon substrate 10 having a platinum silicide contact 11 formed at an upper surface of substrate 10. The platinum silicide contact is electrically isolated from surrounding regions of the semiconductor structure by a region of insulating material 12, typically silicon dioxide. As will be evident from the following description, the particular structure depicted beneath layer 14 is not critical to the invention. Other structures which include arbitrary active and/or passive electronic components, monocrystalline or polycrystalline silicon layers, or other semiconductor structures may also be employed in conjunction with this invention.

On the upper surface of the structure a layer of tungsten-titanium 14, or other desired refractory metal, is deposited. As discussed above, metal 14 functions as a diffusion barrier to prevent aluminum 16 from diffusing into the underlying semiconductor material and changing or destroying electrical characteristics of the device. In a typical semiconductor fabrication process the tungsten-titanium layer 14 will be on the order of 2,000 Angstroms thick.

On the upper surface of tungsten-titanium layer 14 a relatively thick layer of aluminum 16 is deposited, for example, to a thickness of about 7500 Angstroms. For purposes of illustration a layer of photoresist 18 is shown on the upper surface of aluminum 16. Using well-known photolithographic techniques, photoresist 18 has been removed from a region 20 of the upper surface of aluminum 16.

Figure 2:
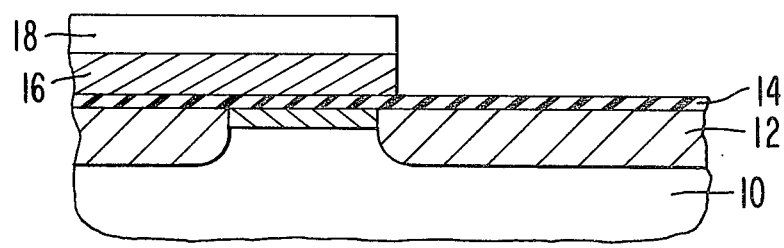
FIG. 2 is a cross-sectional view of the semiconductor structure after etching of the aluminum layer.

Next, using well-known isotropic or anisotropic etching techniques aluminum 16 is removed from the surface of the structure in region 20. According to one well-known technique the aluminum 16 is etched with a plasma containing chlorine. According to another technique aluminum may be removed using a wet chemical etchant such as a mixture of phosphoric, acetic and nitric acids. FIG. 2 depicts the appearance of the structure after the aluminum 16 has been removed from region 20.

Figure 3:
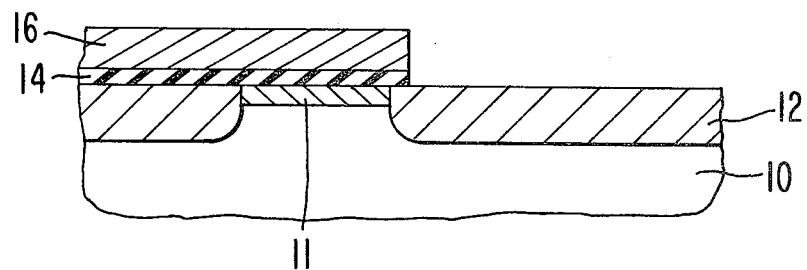
FIG. 3 is a subsequent cross-sectional view of the semiconductor structure after etching the tungsten-titanium layer.

As next shown by FIG. 3 the tungsten-titanium layer 14 is etched from the surface of semiconductor structure wherever it is not protected by an overlying layer, such as aluminum 16. The appearance of the structure after removal of the undersired tungsten-titanium layer 14 is shown in FIG. 3.

We have discovered that tungsten-titanium layer 14 may be etched with superior results by immersing it in a mixture of an organic base, typically a Lewis base, and an oxidizing agent, typically hydrogen peroxide. Such a solution provides a fast etching rate, for example, on the order of up to 4,000 Angstroms per minute, while simultaneously providing the acid neutralization capability necessary. Because the etching solution is organic in nature, the mixture does not have the low resistivity of the ammonium hydroxide/hydrogen peroxide mixture discussed above, and therefore does not exhibit selective accelerated etching and undercutting of ground tapped areas.

Furthermore, we have found that triethylamine $(CH_3Ch_2)_3N$ provides superior results. Triethylamine $(K_B=5.6\times10^{-4})$ is a stronger base than ammonium hydroxide $(K_B=1.79\times10^{-5})$, while having a lower dissociation constant in aqueous solution $(K_A=9.77\times10^{-12})$ as compared to ammonium hydroxide $(K_A=5.59\times10^{-10})$. It has a relatively low dielectric constant, with both water and hydrogen peroxide having substantially higher dielectric constants. The low dielectric constant tends to provide less favorable electrolyte properties of the resultant solution, and hence tends to minimize the formation of any electrochemical cells resulting from the different materials on the semiconductor structure.

Triethylamine is not immediately miscible with hydrogen peroxide, but dissolves readily upon stirring. Because of the exothermic decomposition of hydrogen peroxide the solution is self heating, and the tertiary amine is oxidized to an amine oxide. Maximum temperature is typically reached about 30 minutes after mixing. The etching solution does not degrade either the photoresist or primary aluminum conductor. We have also found highly satisfactory results with ethylene diamine and other organic bases.

EXAMPLES

A mixture of 1 part triethylamine to 5 parts hydrogen peroxide was made. The cold solvents are marginally miscible, but were blended together by stirring. The addition of tungsten-titanium caused the solution to become hot and bubble reaching a temperature of 99° C.

By immersing the wafer, some of the mixture was applied to a wafer having an aluminum layer which had been wet etched, and a tungsten-titanium layer approximately 600 Angstroms thick prior to etching. All photoresist had been removed prior to immersion. The wafer was etched for 40 seconds at a self-generated temperature of about 85° C. The process completely removed the tungsten-titanium layer in the desired locations without undercutting or corroding the aluminum-copper conducting layer.

In another example 500 ml of hydrogen peroxide and 100 ml of triethylamine were mixed in a beaker and the temperature measured. Two halves of wafers were immersed in the solution after 10 minutes when the temperature was about 45° C. One section was metallized with Al:Cu:Si and patterned with photoresist (1450J). The second section had been rinsed in acetone to strip most of the photoresist. After two hours the pieces were removed. The resist was found intact and in place. The Al:Cu:Si was slightly discolored but not etched. We believe the amine is a mild enough base that the Al:Cu:Si is not etched.

In another example a 700 Angstroms film was etched in 10-12 seconds at 56° C. in the above mixture, suggesting an etch rate of 58-70 Angstroms per second (3400-4200 per minute). The solution had been mixed 30 minutes earlier.

Although the foregoing has been a description of the preferred embodiment of the invention, examples thereof, and the best mode for carrying it out, this description is intended to illustrate and explain the invention, rather than limit it. The scope of the invention may be ascertained from the appended claims.

We claim:

1. A method of etching a refractory metal layer on a semiconductor structure comprising subjecting the layer to a mixture of a Lewis base and an oxidizing agent.

2. A method as in claim 1 wherein the refractory metal layer comprises tungsten.

3. A method as in claim 2 wherein the refractory metal layer further comprises titanium.

4. A method as in claim 1 wherein the Lewis base comprises triethylamine.

5. A method as in claim 4 wherein the oxidizing agent comprises hydrogen peroxide.

6. A method as in claim 1 wherein the Lewis base comprises ethylene diamine.

7. A method as in claim 6 wherein the oxidizing agent comprises hydrogen peroxide.

8. A method of etching a tungsten-titanium layer on semiconductor structure comprising subjecting it to a mixture of triethylamine and hydrogen peroxide.

* * * * *